United States Patent
Kang et al.

(10) Patent No.: US 7,531,450 B2
(45) Date of Patent: May 12, 2009

(54) METHOD OF FABRICATING SEMICONDUCTOR DEVICE HAVING CONTACT HOLE WITH HIGH ASPECT-RATIO

(75) Inventors: Yun-Seung Kang, Seoul (KR); Jun Seo, Kyeonggi-do (KR); Min-Chul Chae, Gyeonggi-do (KR); Jae-Seung Hwang, Gyeonggi-do (KR); Sung-Un Kwon, Gyeonggi-do (KR); Woo-Jin Cho, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 159 days.

(21) Appl. No.: 11/759,788

(22) Filed: Jun. 7, 2007

(65) Prior Publication Data

US 2007/0287287 A1    Dec. 13, 2007

(30) Foreign Application Priority Data

Jun. 7, 2006    (KR) ............... 10-2006-0050135

(51) Int. Cl.
*H01L 21/44*    (2006.01)

(52) U.S. Cl. ............... 438/639; 438/702; 438/638; 438/507; 257/E21.49; 257/E21.488

(58) Field of Classification Search ............... 438/638, 438/639, 640, 702, 945, 947, 740, 675, 507; 257/E21.49, E21.488, E21.487
See application file for complete search history.

(56) References Cited

U.S. PATENT DOCUMENTS 6,329,290 B1 * 12/2001 Zhao .................. 438/700
6,531,358 B1 * 3/2003 Yu .................. 438/253
6,593,246 B1    7/2003 Hasegawa et al.
6,750,544 B1 * 6/2004 Spano et al. ............ 257/758
2004/0124509 A1 * 7/2004 Kim et al. ............ 257/678
2007/0181882 A1    8/2007 Lee

FOREIGN PATENT DOCUMENTS

| JP | 05-121371 | 5/1993 |
| JP | 09-129604 | 5/1997 |
| JP | 2001-44189 | 2/2001 |
| JP | 2002-26122 | 1/2002 |
| JP | 2004-311477 | 11/2004 |
| KR | 2000-0076668 | 12/2000 |
| KR | 2003-0051720 | 6/2003 |
| KR | 10-2005-0063327 | 6/2005 |
| KR | 10-2006-0057821 | 5/2006 |
| KR | 10-2006-0095160 | 8/2006 |

* cited by examiner

*Primary Examiner*—Caridad M Everhart
(74) *Attorney, Agent, or Firm*—Marger Johnson & McCollom, P.C.

(57) ABSTRACT

Provided is a method of fabricating a semiconductor device having a contact hole with a high aspect-ratio. The method includes: sequentially forming a lower pattern and an upper layer on a semiconductor substrate; sequentially forming a lower mask layer and an upper mask layer on the upper layer; sequentially patterning the lower and upper mask layers to form a hole exposing a top surface of the upper layer on the lower pattern; using the upper mask layer as an etching mask to anisotropically etch the exposed top surface to form an upper contact hole exposing a top surface of the lower pattern; and using the lower mask layer as an etching mask to anisotropically etch the exposed lower pattern to form a lower contact hole in the lower pattern, the lower contact hole extending from the upper contact hole.

20 Claims, 12 Drawing Sheets

METHOD OF FABRICATING SEMICONDUCTOR DEVICE HAVING CONTACT HOLE WITH HIGH ASPECT-RATIO

CROSS-REFERENCE TO RELATED APPLICATIONS

This U.S. non-provisional patent application claims priority under 35 U.S.C. § 119 to Korean Patent Application No. 2006-51035, filed on Jun. 7, 2006, the entire contents of which are hereby incorporated by reference.

BACKGROUND

1. Technical Field

The present invention disclosed herein relates to a method of fabricating a semiconductor device, and more particularly, to a method of fabricating a semiconductor device having a contact hole with a high aspect-ratio.

2. Description of the Related Art

A semiconductor device includes transistors integrated on a semiconductor substrate. In a conventional semiconductor device, the transistors are disposed on a semiconductor wafer two-dimensionally. When the transistors are two-dimensionally arranged, the degree of integration in the semiconductor device is determined by the size of the minimum line width, which is formed during a patterning process. However, since very expensive optical equipment is required to form a delicate line width pattern, recently techniques in which transistors are arranged three-dimensionally have been suggested. Some semiconductor devices having three-dimensionally arranged transistors and methods of fabricating the same are disclosed by Samsung Electronics in Korean Patent Applications No. 2004-97003, No. 2005-16608, and No. 2006-12712. Specifically, since the transistors are fabricated on a semiconductor such as silicon, forming of an additional semiconductor layer on a semiconductor wafer is required to form transistors three-dimensionally. According to the Korean Patent Application No. 2004-97003, the additional semiconductor layer may be formed using an epitaxial technique that uses the semiconductor wafer as a seed layer.

On the other hand, according to the three-dimensionally arranged transistors, the degree of integration in the semiconductor device may increase, but the line formation for accessing each of the transistors becomes more difficult compared to a semiconductor device having two-dimensionally arranged transistors. In more detail, as disclosed in the Korean Patent Application No. 2004-97003, a lower circuit is formed on a semiconductor wafer; at least one semiconductor layer is formed on the lower circuit by using an epitaxial process; an upper circuit is formed on the semiconductor layer; and lines (e.g., bit lines or source lines) that are connected to the lower and/or upper circuits are formed on the upper circuit. Consequently, the distance between the line and the semiconductor wafer is drastically increased in the case of a semiconductor device with three-dimensionally arranged transistors. This distance determines the depth required of a contact hole, which is formed below the lines. Methods of fabricating conventional contact holes will be described below with reference to FIGS. 1A and 1B, but those methods are inappropriate for forming the contact holes having the increased depth in a desirable shape for three-dimensionally arranged transistors.

Figure 1A:
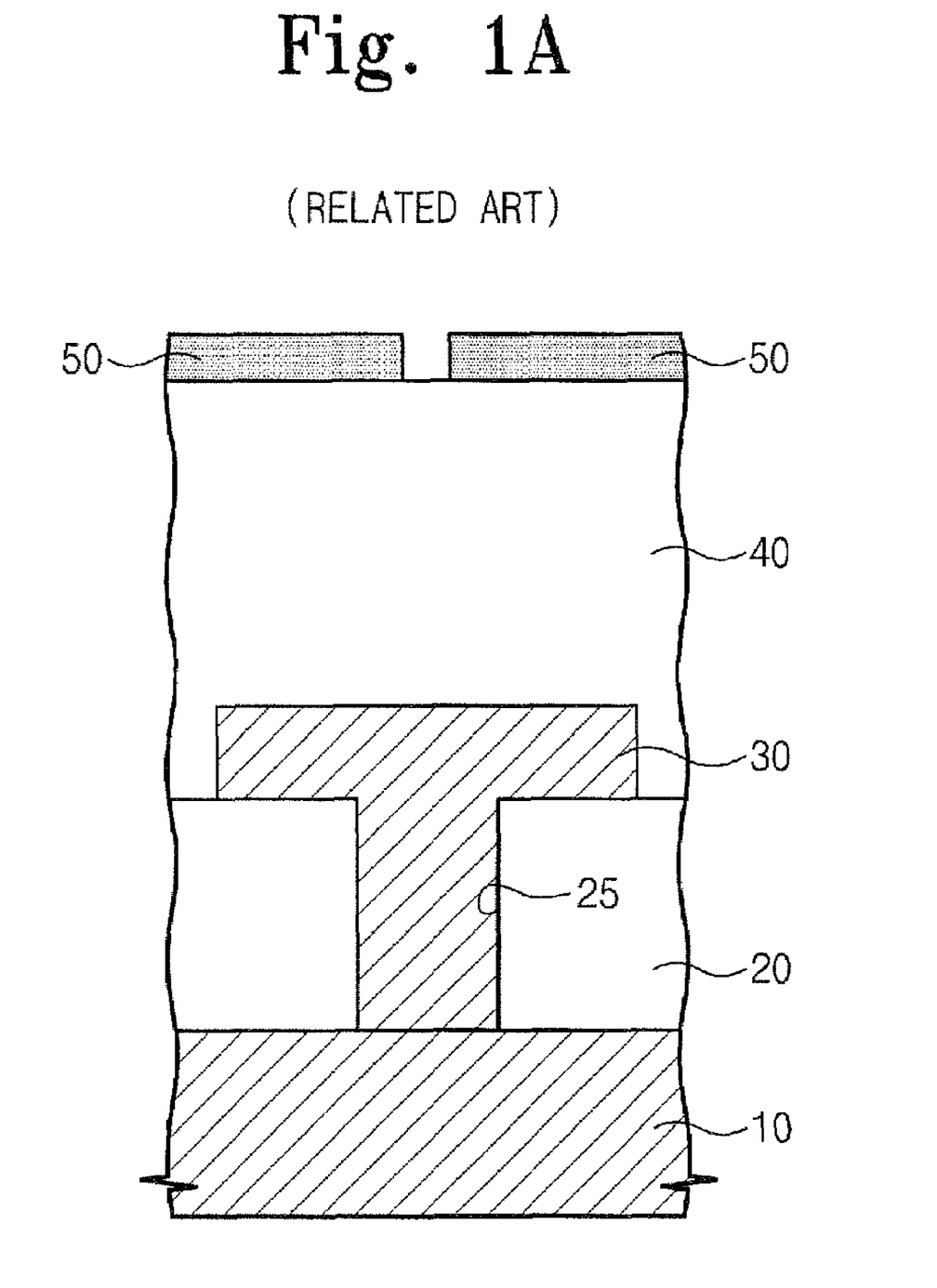
FIGS. 1A and 1B are cross-sectional views illustrating a conventional method of forming a contact hole.
Figure 1B:
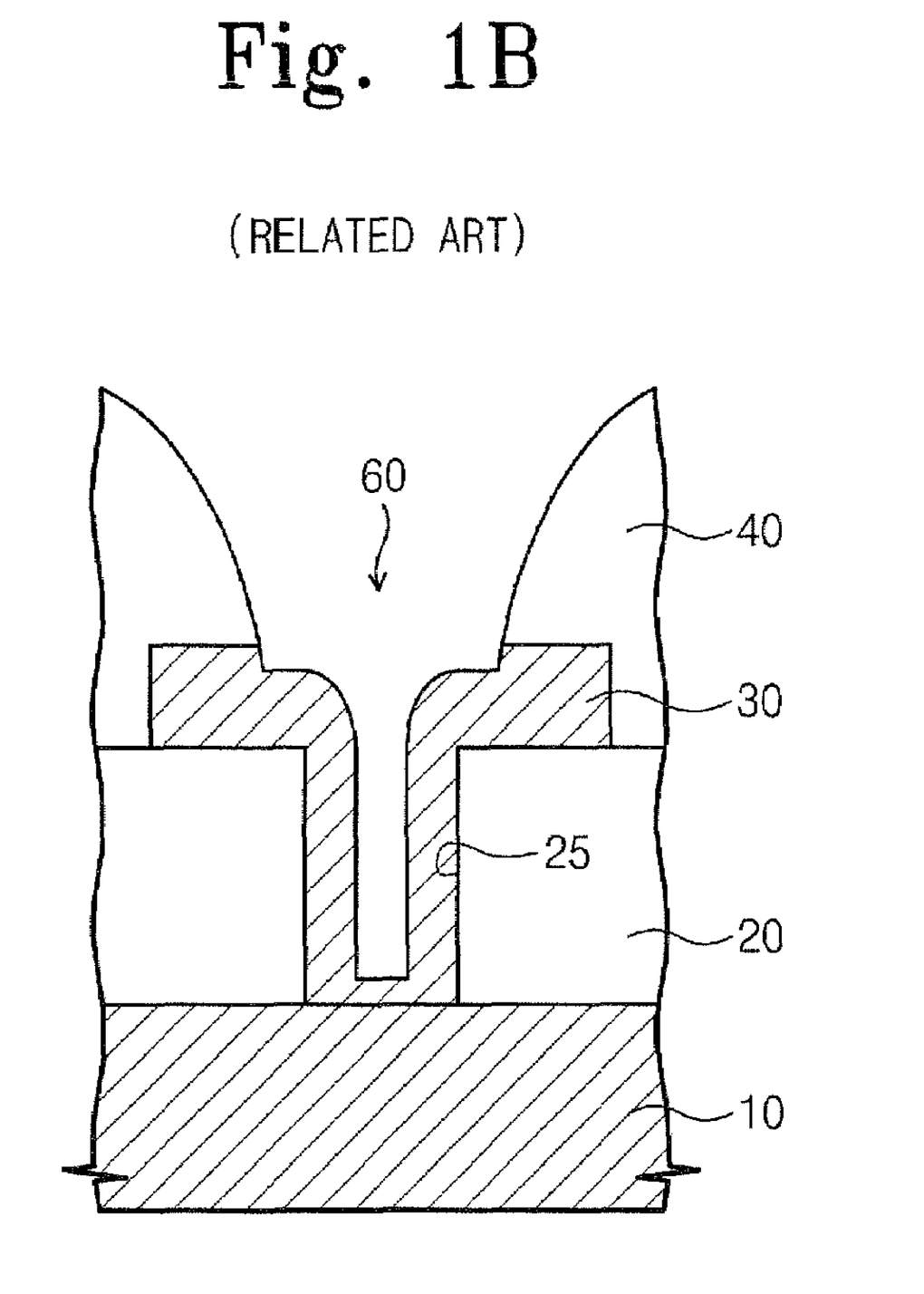

FIGS. 1A and 1B are cross-sectional views of a manufacturing process illustrating a method of forming a conventional contact hole.

Referring to FIG. 1A, transistors (not shown) that constitute a lower circuit are formed on a semiconductor wafer 10, and a lower interlayer insulating layer 20 is formed to cover the transistors. Next, the lower interlayer insulating layer 20 is patterned to form openings 25 that expose an upper surface of the semiconductor wafer 10, and then an epitaxial process is performed using the exposed semiconductor wafer 10 as a seed layer to form a semiconductor layer 30 that is disposed on the lower interlayer insulating layer 20 and fills the openings 25. An upper circuit (not shown) is formed on the semiconductor layer 30. An upper interlayer insulating layer 40 and a mask pattern 50 are sequentially formed on the resulting structure having the upper circuit.

Referring to FIG. 1B, the mask pattern 50 is used as an etching mask to sequentially pattern the upper interlayer insulating layer 40 and the semiconductor layer 30. Consequently, a contact hole 60 is formed in the upper interlayer insulating layer 40 and the semiconductor layer 30, and then a plug (not shown) is filled in the contact hole 60 to electrically connect a line with the semiconductor layer 30. As is well-known in the art, electric potentials of a gate electrode, source/drain electrodes and a substrate (i.e., well) need to be independently controlled for normally operating the transistors. Especially, for controlling the electric potential of the well, a well pick-up plug may be disposed between the semiconductor wafer 10 and the line.

On the other hand, although the semiconductor layer 30 is required to be formed with a thickness of several thousand angstroms, it has a relatively large electric resistance due to a low concentration of impurities. Accordingly, the well pick-up plug needs to be formed adjacent to the top surface of the semiconductor wafer 10 to reduce electric resistance between the well and the line. According to the technical requirements of the semiconductor device being manufactured, the forming of the contact hole 60 may include etching the semiconductor layer 30 with a depth of several thousand angstroms.

Figure 2A:
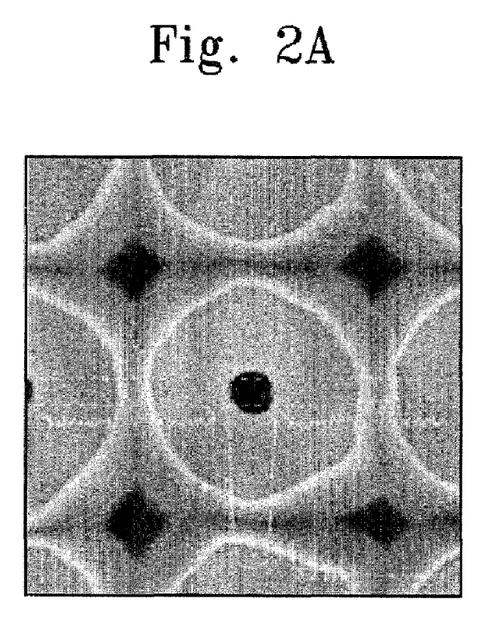
FIGS. 2A and 2B are images of an expansion phenomenon occurring in a contact hole according to a conventional method of forming the contact hole.
Figure 2B:
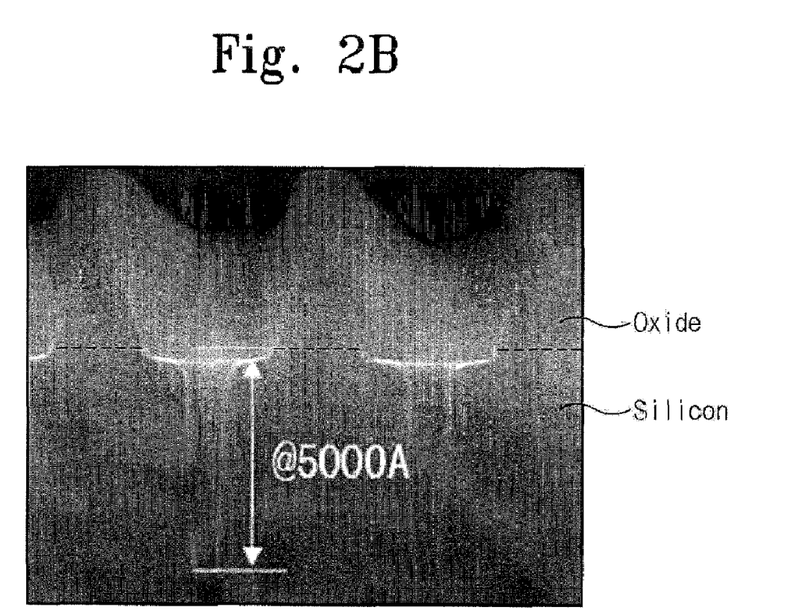

However, according to the conventional technique, the upper interlayer insulating layer 40 is formed of a silicon oxide layer, and the mask pattern 50 is formed of a silicon nitride layer that has an etch selectivity with respect to the upper interlayer insulating layer 40. In this case, since the mask pattern 50 (i.e., silicon nitride layer) does not have an etch selectivity with respect to the semiconductor layer 30 (i.e., silicon layer), the mask pattern 50 may be removed while etching the semiconductor layer 30, and thus the upper interlayer insulating layer 40 may be exposed. Consequently, as illustrated in FIGS. 1B, 2A, and 2B, the upper portion of the contact hole 50 widens and this causes technical difficulties and product defects during subsequent processes. The present invention addresses these and other disadvantages of the conventional art.

SUMMARY

The present invention provides a method of fabricating a semiconductor device having a contact hole with a high aspect-ratio. The present invention also provides a method of fabricating a semiconductor device having a contact hole with a high aspect-ratio, without etching damage to an upper layer when a lower layer and the upper layer are made of respectively different materials.

Embodiments of the present invention provide methods of fabricating a semiconductor device, the methods comprising: sequentially forming a lower pattern and an upper layer on a semiconductor substrate; sequentially forming a lower mask layer and an upper mask layer on the upper layer; sequentially patterning the lower and upper mask layers to form a hole exposing a top surface of the upper layer on the lower pattern; using the upper mask layer as an etching mask to anisotropically etch the exposed top surface to form an upper contact hole exposing a top surface of the lower pattern; and using the lower mask layer as an etching mask to anisotropically etch the exposed lower pattern to form a lower contact hole in the lower pattern, the lower contact hole extending from the upper contact hole.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Hereinafter, an exemplary embodiment of the present invention will be described in conjunction with the accompanying drawings.

FIGS. 3A through 3D are cross-sectional views illustrating a method of forming a contact hole according to a first embodiment of the present invention. FIGS. 4A and 4B are the resulting images of a method of forming a contact hole according to the first embodiment of the present invention. FIGS. 5A through 5E are cross-sectional views illustrating a method of forming a well pick-up in a NAND flash memory having three-dimensionally arranged transistors.

Figure 3A:
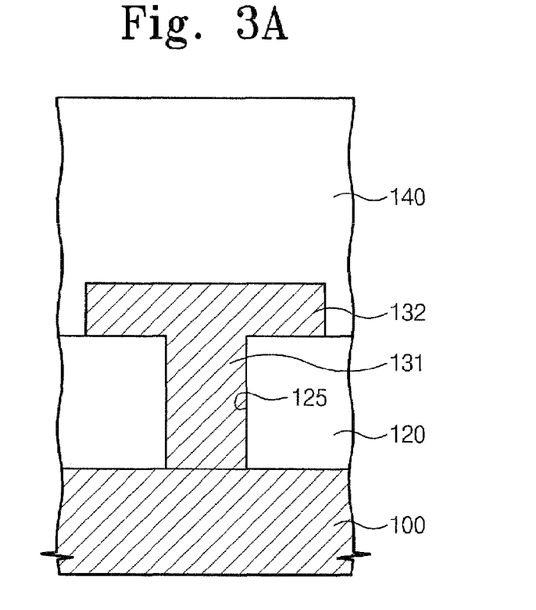
FIGS. 3A through 3D are cross-sectional views illustrating a method of forming a contact hole according to a first embodiment of the present invention.
Figure 4A:
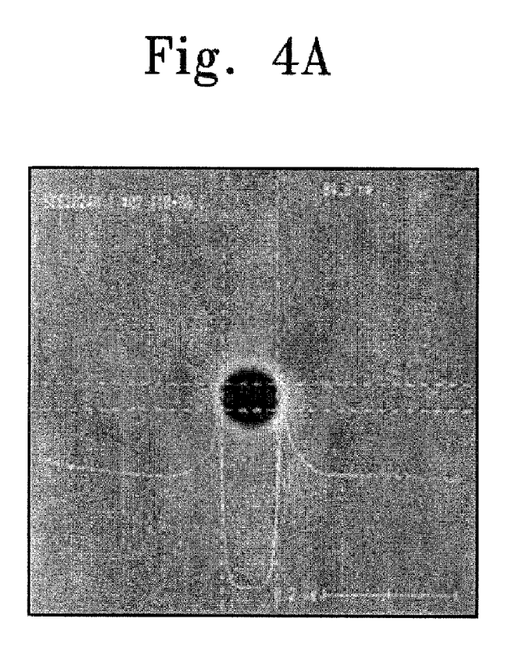
FIGS. 4A and 4B are the resulting images of a method of forming a contact hole according to the first embodiment of the present invention.
Figure 4B:
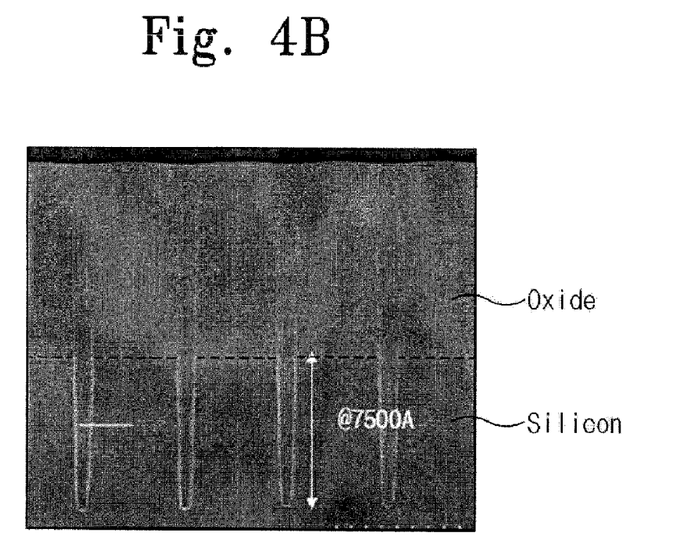
Figure 5A:
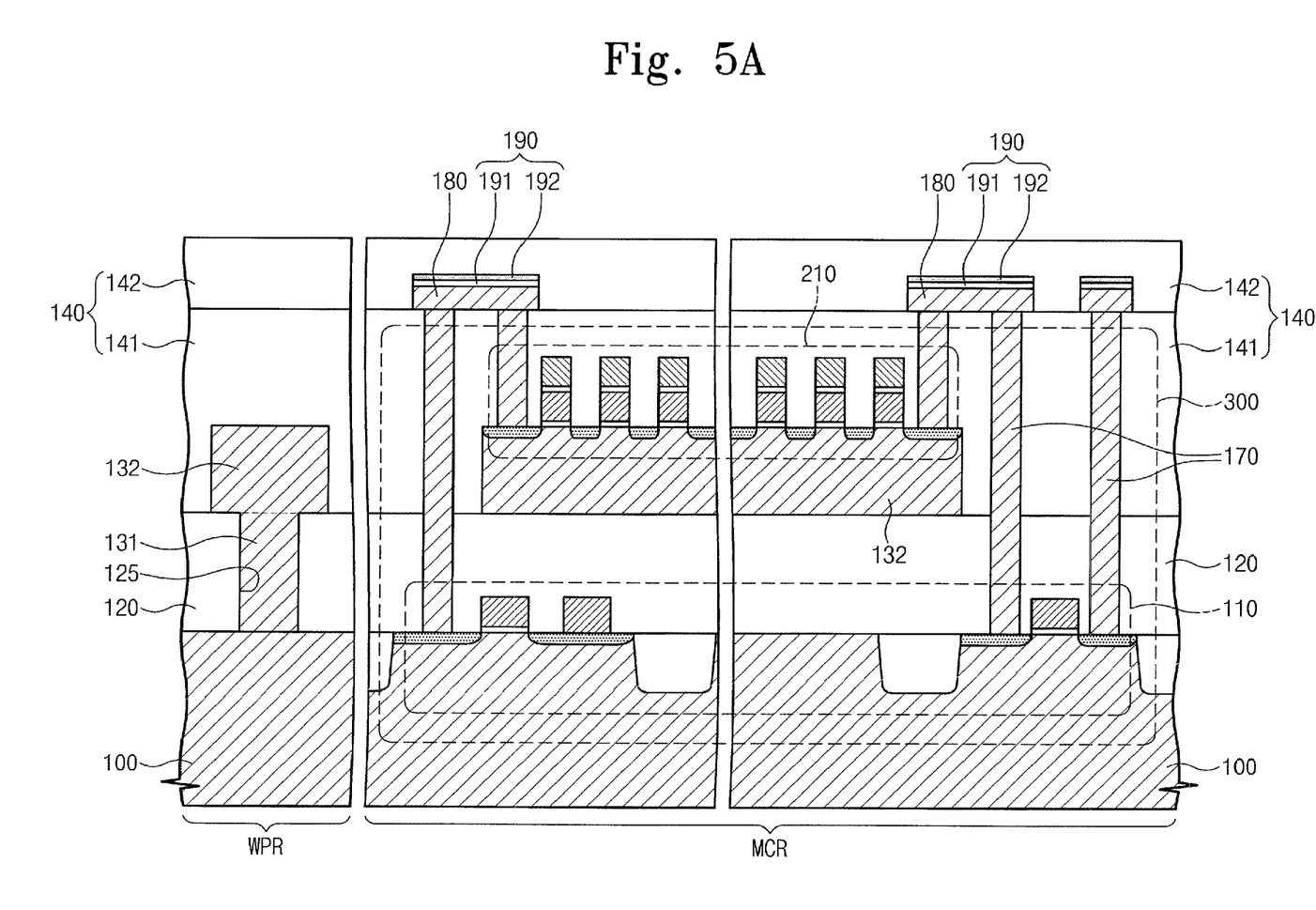
FIGS. 5A through 5E are cross-sectional views illustrating a method of forming a well pick-up in a NAND flash memory having three-dimensionally arranged transistors.

Referring to FIGS. 3A and 5A, after forming a lower circuit 110 on a semiconductor wafer 100, a lower interlayer insulating layer 120 is formed on the semiconductor wafer 100 having the lower circuit 110. Next, the lower interlayer insulating layer 120 is patterned to form a seed opening part 125 to expose the top surface of the semiconductor wafer 100. An epitaxial process is performed by using the semiconductor wafer 100, which is exposed through the seed opening part 125, as a seed layer in order to form a seed pattern 131 filling the seed opening part 125 and a semiconductor layer 132 extending from the seed pattern 131 to the top of the bottom interlayer insulating layer 120. An upper interlayer insulating layer 140 is formed on the semiconductor layer 132.

According to the first embodiment, the semiconductor wafer 100 includes a memory cell region MCR and a peripheral circuit region, and the lower circuit 110 includes transistors disposed on the regions. At this point, the structure of the transistors disposed on the respective regions may vary according to the kinds of semiconductor devices. For example, as illustrated in FIG. 5A, in the case of a NAND flash memory device, select transistors and common source lines connected thereto are disposed on the memory cell region MCR, and high voltage transistors and low voltage transistors may be disposed on the peripheral circuit region constituting a circuit that drives the memory transistors.

Furthermore, as illustrated in FIG. 5A, a well pick-up region WPR for controlling a bulk bias in the transistors is disposed around the memory cell region MCR or the peripheral circuit region. According to some embodiments of the present invention, the seed opening part 125 may be formed on the well pick-up region WPR. In this case, the seed pattern 131 connecting the semiconductor layer 132 with the semiconductor wafer 100 is formed on the well pick-up region WPR.

The lower interlayer insulating layer 120 is formed of an insulating material including a silicon oxide layer. According to the first embodiment of the present invention, the lower interlayer insulating layer 120 includes a silicon nitride layer and a silicon oxide layer, which are sequentially stacked. In this case, the silicon nitride layer is formed to conformally cover the lower circuit 110, and the silicon oxide layer is formed to have a planar top surface. For this, the silicon oxide layer is formed by depositing the silicon oxide layer thicker than the lower circuit and then planarizing the resulting structure.

The upper interlayer insulating layer 140 may be formed of an insulating material including a silicon oxide layer. According to the first embodiment of the present invention, as illustrated in FIG. 5A, the upper interlayer insulating layer 140 may include a first insulating layer 141 and a second insulating layer 142.

The seed pattern 131 and the semiconductor layer 132 may be formed using a selective epitaxial process that grows single crystal silicon at 800° C. through a process gas including DCS and HCl. Next, a predetermined heat treatment process may be further performed to stabilize the grown single crystal silicon layer. The semiconductor layer 132 is formed with a thickness that can cover an entire top surface of the lower interlayer insulating layer 120, and then can be planarized using a planarization etching process such as a chemical mechanical polishing process. According to some embodiments of the present invention, the sum of the thicknesses of the seed pattern 131 and the semiconductor layer 132 may be between 3000 and 10000 Å. On the other hand, the epitaxial process for forming the seed pattern 131 and the semiconductor layer 132 may be performed using one of a solid epitaxial technique, a liquid epitaxial technique, and a gas epitaxial technique.

Moreover, as illustrated in FIG. 5A, transistors constituting an upper circuit 210 are formed on the semiconductor layer 132. Referring to FIG. 5A, the upper circuit 210 may be non-volatile memory transistors connected in serial and connected to the lower circuit 110. Additionally, the upper circuit 210 and the lower circuit 110 are disposed on one side of the semiconductor layer 132 to be electrically connected to each other through source/drain plugs 170 and line patterns 180. The source/drain plugs 170 pass through the lower interlayer insulating layer 120 and the first insulating layer 141, and the line patterns 180 are disposed on the first insulating layer 141 to connect to the source/drain plugs 170. Consequently, the upper circuit 210 and the lower circuit 110 constitute a cell array of a NAND flash memory.

Furthermore, a capping layer 190 may be further formed on the line patterns 180. The capping layer 190 may be used as an etching mask or an anti-reflective layer in a patterning process for forming the line patterns 180. According to some embodiments of the present invention, the capping layer 190 is used to prevent the etching damage of the line pattern 180 in the next contact hole forming process, and this will be described below.

According to some embodiments, the present invention is related to a method of forming a contact hole having a high aspect-ratio while passing through the upper interlayer insulating layer 140 and the semiconductor layer 132. Thus, this method is independent of the kinds of the semiconductor devices. Accordingly, a function circuit 300 including the lower circuit 110 and the upper circuit 210 is not limited to the first embodiment of the present invention in FIG. 5A, and may vary if necessary. Also, the contact hole of the present invention may not be formed in the well pick-up region WPR.

Figure 3B:
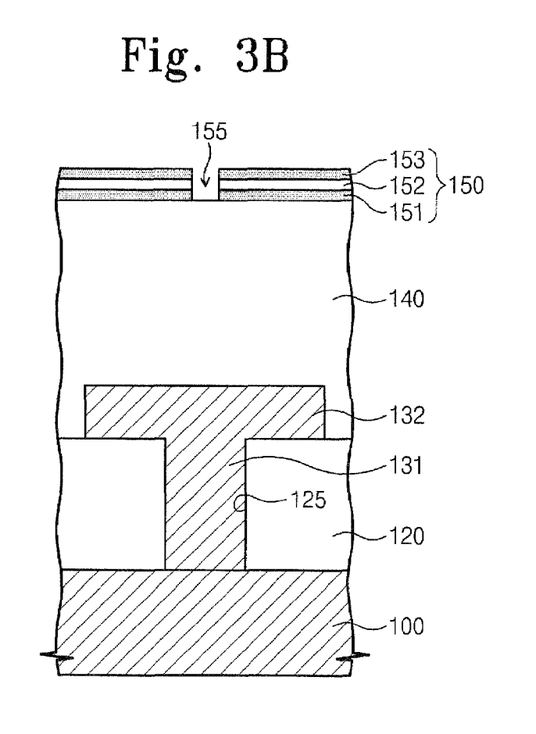
Figure 5B:
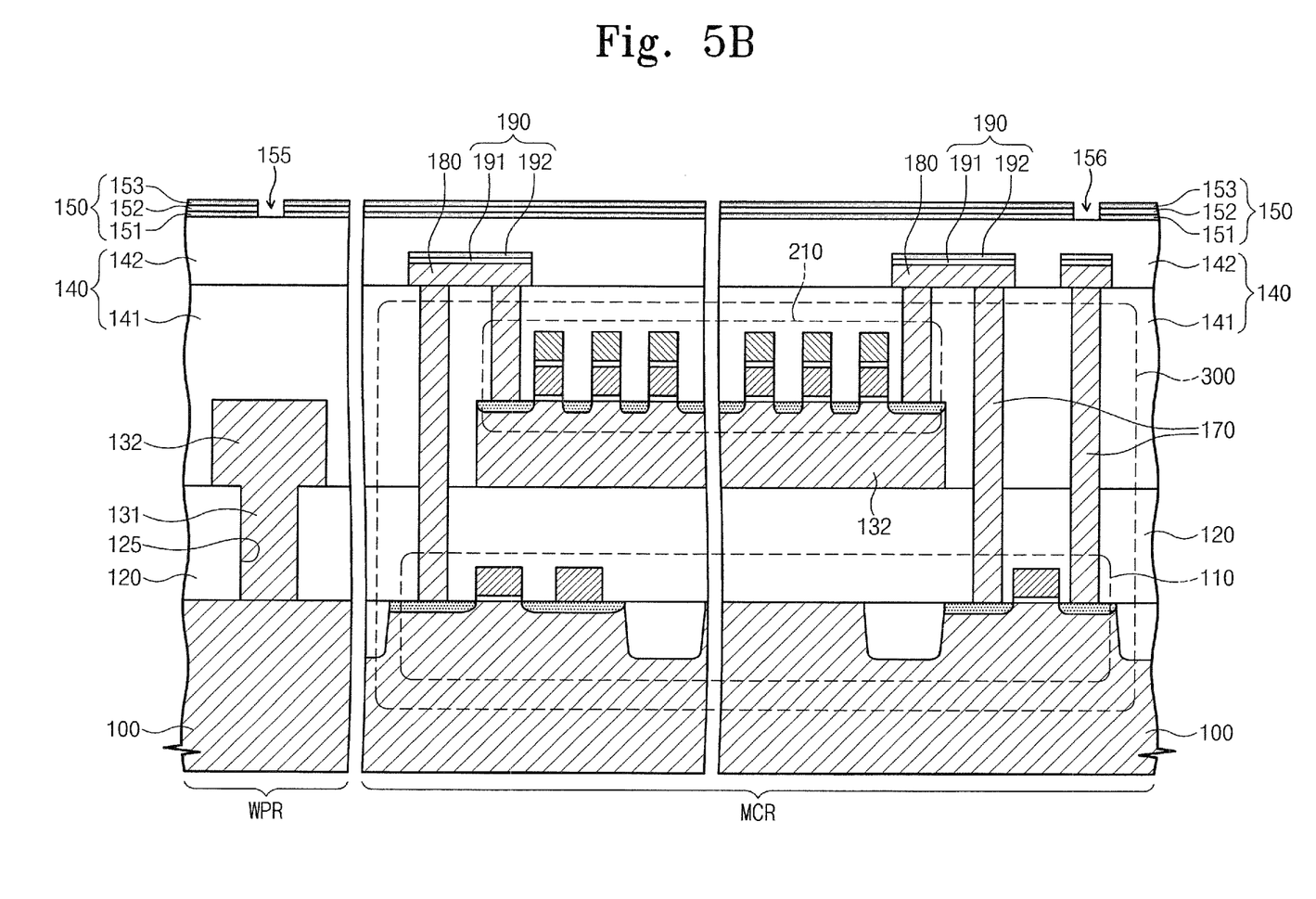

Referring to FIGS. 3B and 5B, after forming a mask layer 150 on the upper interlayer insulating layer 140, the mask layer 150 is patterned to form a first hole 155 that exposes the upper interlayer insulating layer 140 above the seed opening part 125. According to the first embodiment of the present invention, as illustrated in FIG. 5B, a second hole 156 may be formed on the memory cell region MCR that exposes the upper interlayer insulating layer 140 above a predetermined region of the line pattern 180. The second hole 156 may be formed using the same process used for the first hole 155.

According to some embodiments of the present invention, the mask layer 150 may include a lower mask layer 152 and an upper mask layer 153, which are sequentially stacked. At this point, the upper mask layer 153 is formed of a material having an etch selectivity with respect to the upper interlayer insulating layer 140, and the lower mask layer 152 is formed of a material having an etch selectivity with respect to the semiconductor layer 132. As used here, "a layer A has an etch selectivity with respect to a layer B" means that the etch rate of the layer A is negligible as compared to that of the layer B during an etching process for the layer B. For example, the upper mask layer 153 may be one of a silicon nitride layer and a polycrystalline silicon layer having an etch selectivity with respect to a silicon oxide layer, and the lower mask layer 152 may be a silicon oxide layer having an etch selectivity with respect to a silicon layer forming the semiconductor layer 132.

According to the second embodiment of the present invention, the mask layer 150 may further include an auxiliary mask layer 151 interposed between the upper interlayer insulating layer 140 and the lower mask layer 152. The auxiliary mask layer 151 may be formed of a material having an etch selectivity with respect to the lower mask layer 152. For example, the auxiliary mask layer 151 may be formed of a silicon nitride layer.

Figure 3C:
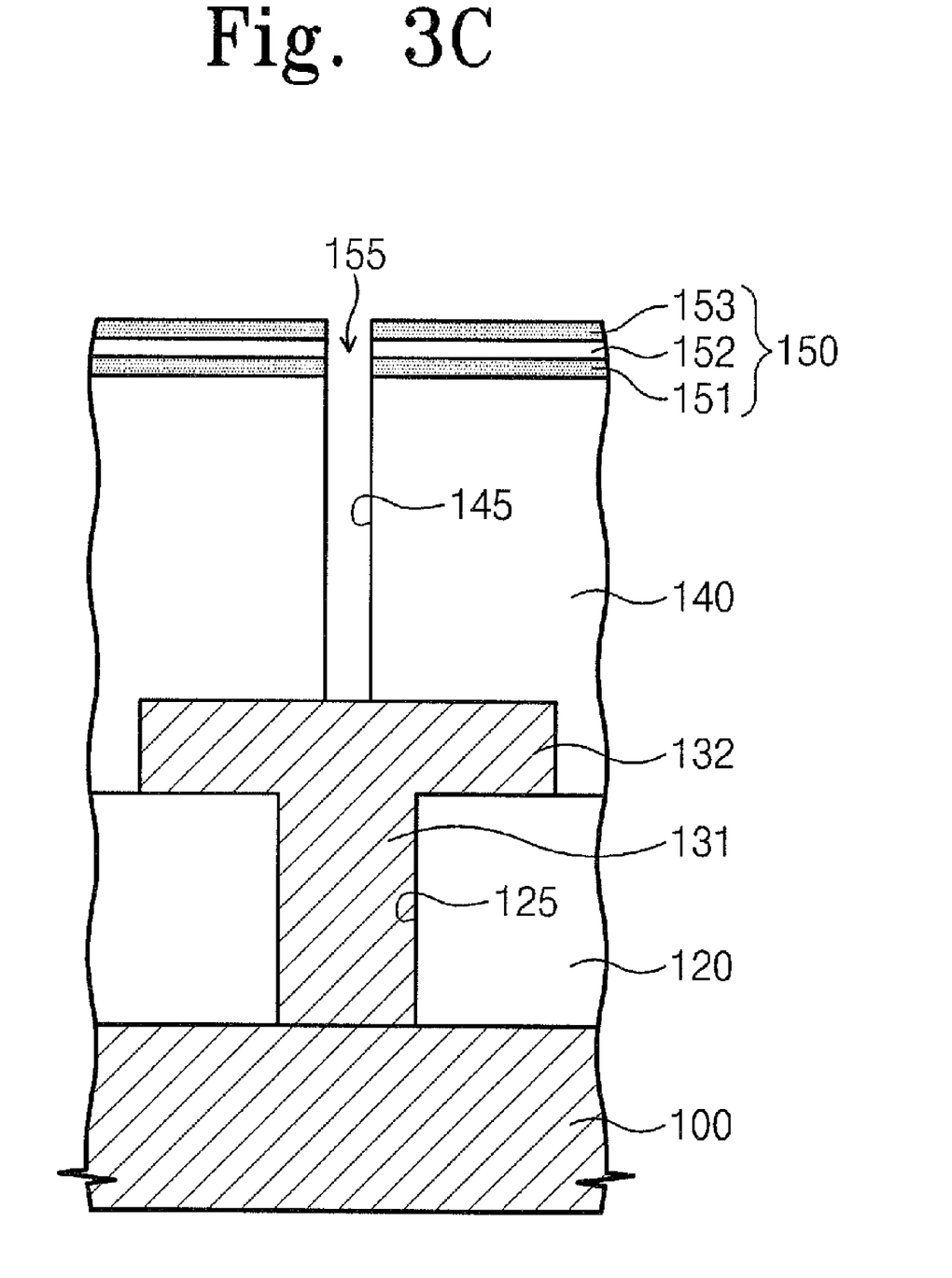

Referring to FIG. 3C, the mask layer 150 is used as an etching mask to anisotropically etch the upper interlayer insulating layer 140 that is exposed through the first hole 155 such that a first upper contact hole 145 is formed to expose the top surface of the semiconductor layer 132. This process is performed under the condition that the etch rate of the upper interlayer insulating layer 140 is much larger compared to the etch rate of the upper mask layer 153. For example, the above process condition can be obtained by using gas, which includes F such as $NF_3$, $SF_6$, $C_2F_6$, $C_3F_8$, $C_4F_8$, and $CF_4$ or $CHF_3$, as an etching gas. However, well-known other various anisotropic etching methods may be used for the above process.

Figure 5C:
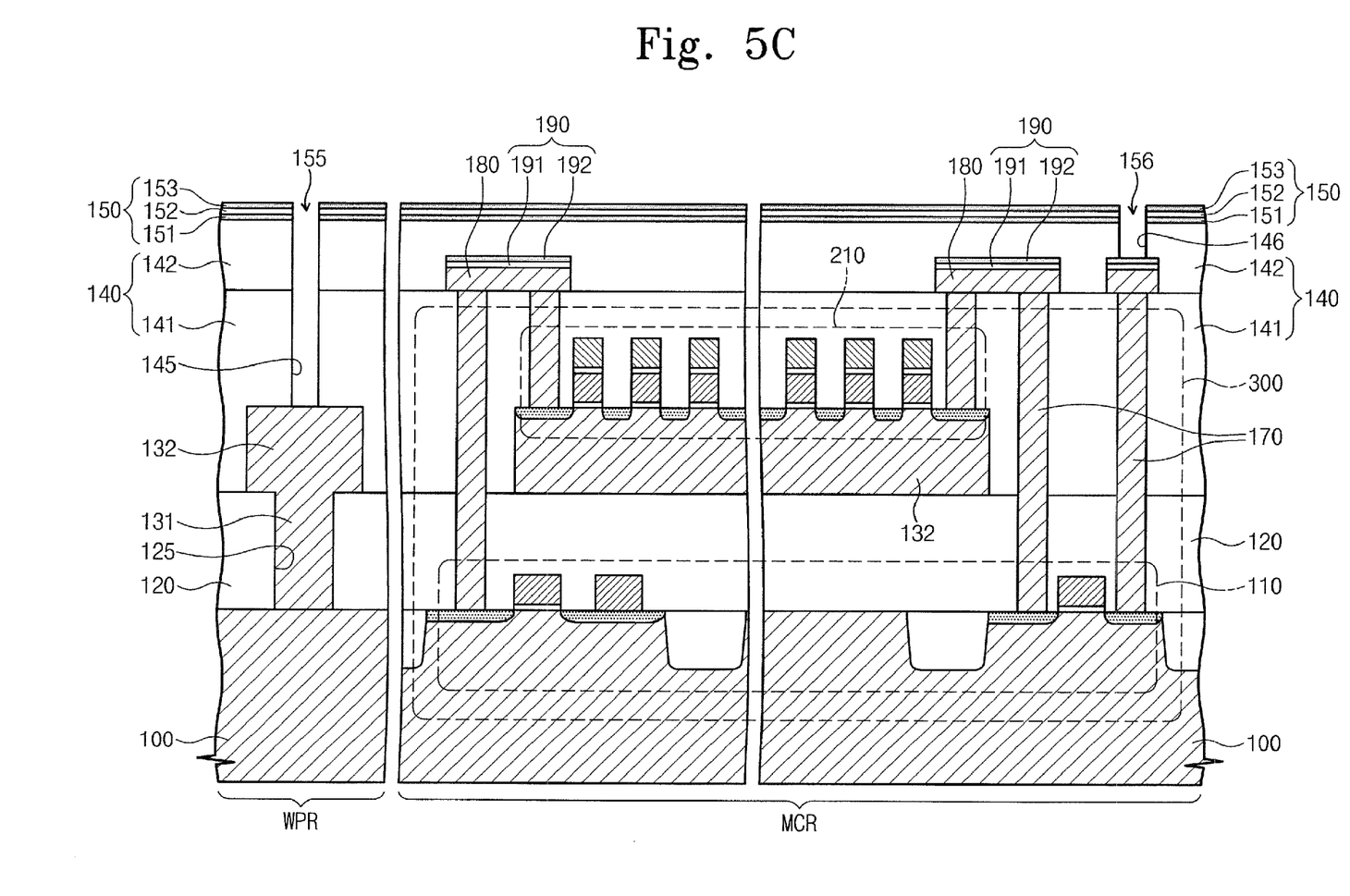

According to some embodiments, referring to FIG. 5C, the upper interlayer insulating layer 140 exposed through a second hole 156 is etched simultaneously when the first upper contact hole 145 is formed using an etching process. Consequently, a second upper contact hole 146 is formed below the second hole 156 to expose the capping layer 190.

According to the first embodiment of the present invention, the capping layer 190 may include a lower capping layer 191 and an upper capping layer 192, which are sequentially stacked. At this point, the upper capping layer 192 is used as an etch stop layer during an etching process for forming the second upper contact hole 146. Accordingly, the etching damage for a line pattern 180 may be prevented during the etching process. For this, the upper capping layer 192 is formed of a material having an etch selectivity with respect to the upper interlayer insulating layer 140. For example, the upper capping layer 192 may be one of a silicon nitride layer and a silicon oxide nitride layer.

Figure 3D:
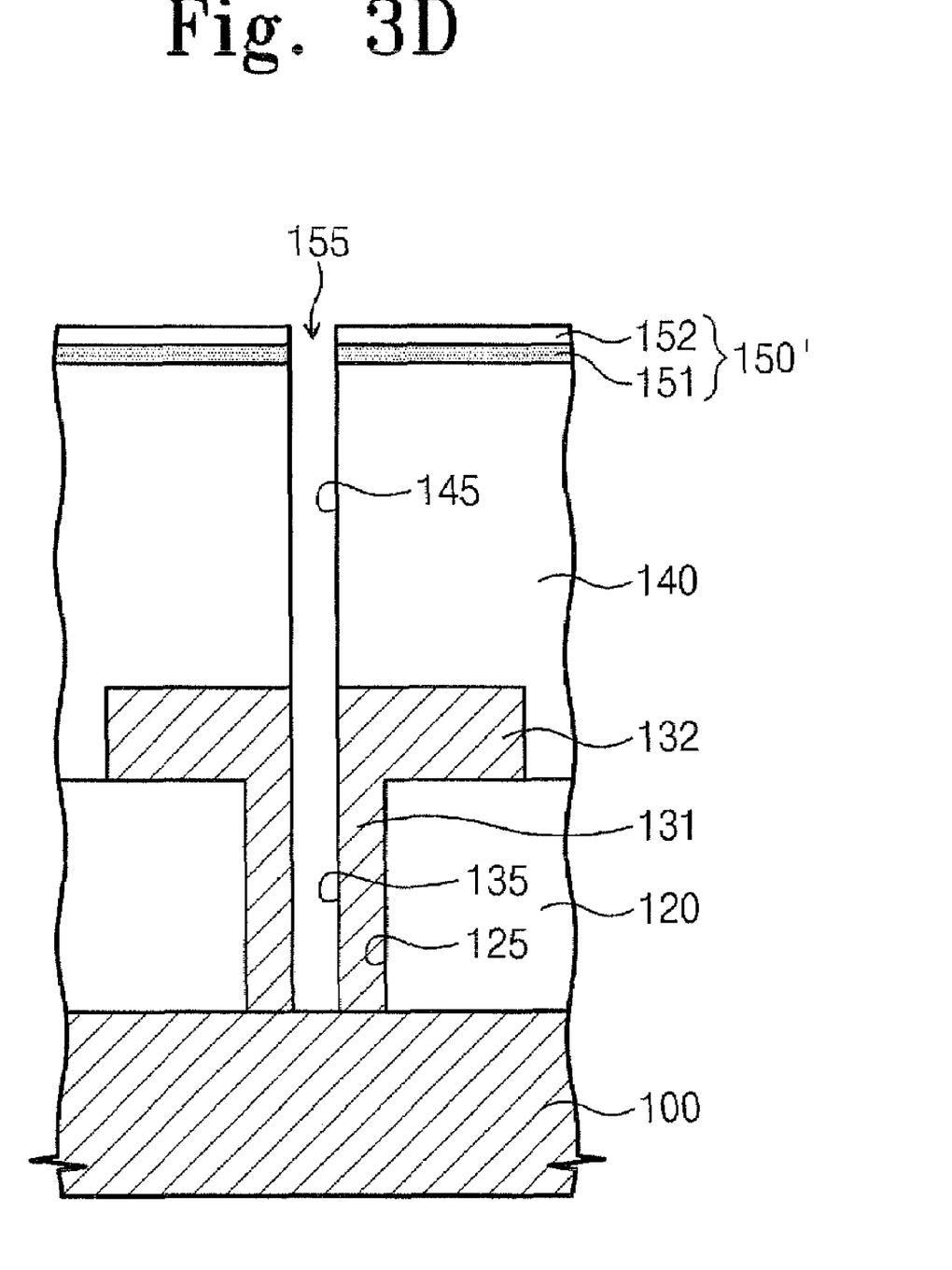

Referring to FIG. 3D, the mask layer 150 is used as an etching mask to anisotropically etch the semiconductor layer 132 exposed through the first upper contact hole 145 such that a lower contact hole 135 is formed. According to some embodiments of the present invention, this etching process is performed under the condition that the etch rate of the semiconductor layer 132 is much larger compared to that of the lower mask layer 152. For example, according to the process condition, gas including Cl such as $Cl_2$ and $CCl_4$ may be used as an etching gas, but well-known other various anisotropic etching methods can be used for this process.

According to the first embodiment of the present invention, the lower contact hole 135 passes through the seed opening part 125 to expose the top surface of the semiconductor wafer 100. In this case, the depth of the lower contact hole 135 may be substantially identical to the sum (i.e., between 3000 and 10000 Å) of the thicknesses of the seed pattern 131 and the semiconductor layer 132. Due to the large depth of the lower contact hole 135, the upper mask layer 153 may be removed during this etching process. In conventional methods, the problematic expansion of the conventional contact hole is caused by the removal of the top mask layer 153. However, according to some embodiments of the present invention, because the lower contact hole 135 is formed by using an etch recipe having an etch selectivity with respect to the lower mask layer 152, the lower contact hole 135 may expand without the expansion of the first top contact hole 145. In other words, according to some embodiments of the present invention, the lower contact hole 135 can have a high aspect ratio without the lateral expansion problems of the conventional methods. For example, as illustrated in FIGS. 4A and 4B, the method of forming the contact hole according to some embodiments of the present invention can form the lower contact hole 135 having a 7500 Å depth without the expansion of the first upper contact hole 145. Furthermore, as illustrated in FIGS. 4A and 4B, a contact hole having an aspect-ratio of more than 15 without the expansion of the first upper contact hole 145 is formed according to the method of the present invention.

According to some embodiments of the present invention, anisotropic etching processes for forming the first upper contact hole 145 and the lower contact hole 135 may be continuously performed in the same process chamber. Furthermore, the forming of the first and second holes 155 and 156 may also be performed in a process chamber for forming the first upper contact hole 145 and the lower contact hole 135.

According to another embodiment of the present invention, the lower contact hole 135 does not pass through the seed pattern 131 but passes through the lower interlayer insulating layer 120 to expose the top surface of the semiconductor wafer 100. In this case, the mask layer 150 further includes a material layer having an etch selectivity with respect to the lower interlayer insulating layer 120. According to the embodiments of the present invention, since the lower interlayer insulating layer 120 may be formed of a silicon oxide layer, the auxiliary mask layer 151 formed of a silicon nitride layer may be used as an etching mask during the etching of the lower interlayer insulating layer 120. Furthermore, according to a further embodiment of the present invention, in the case of a semiconductor device insensitive to the electric resistance of the seed pattern 131, the lower contact hole 135 may not expose the top surface of the semiconductor wafer 100.

Figure 5D:
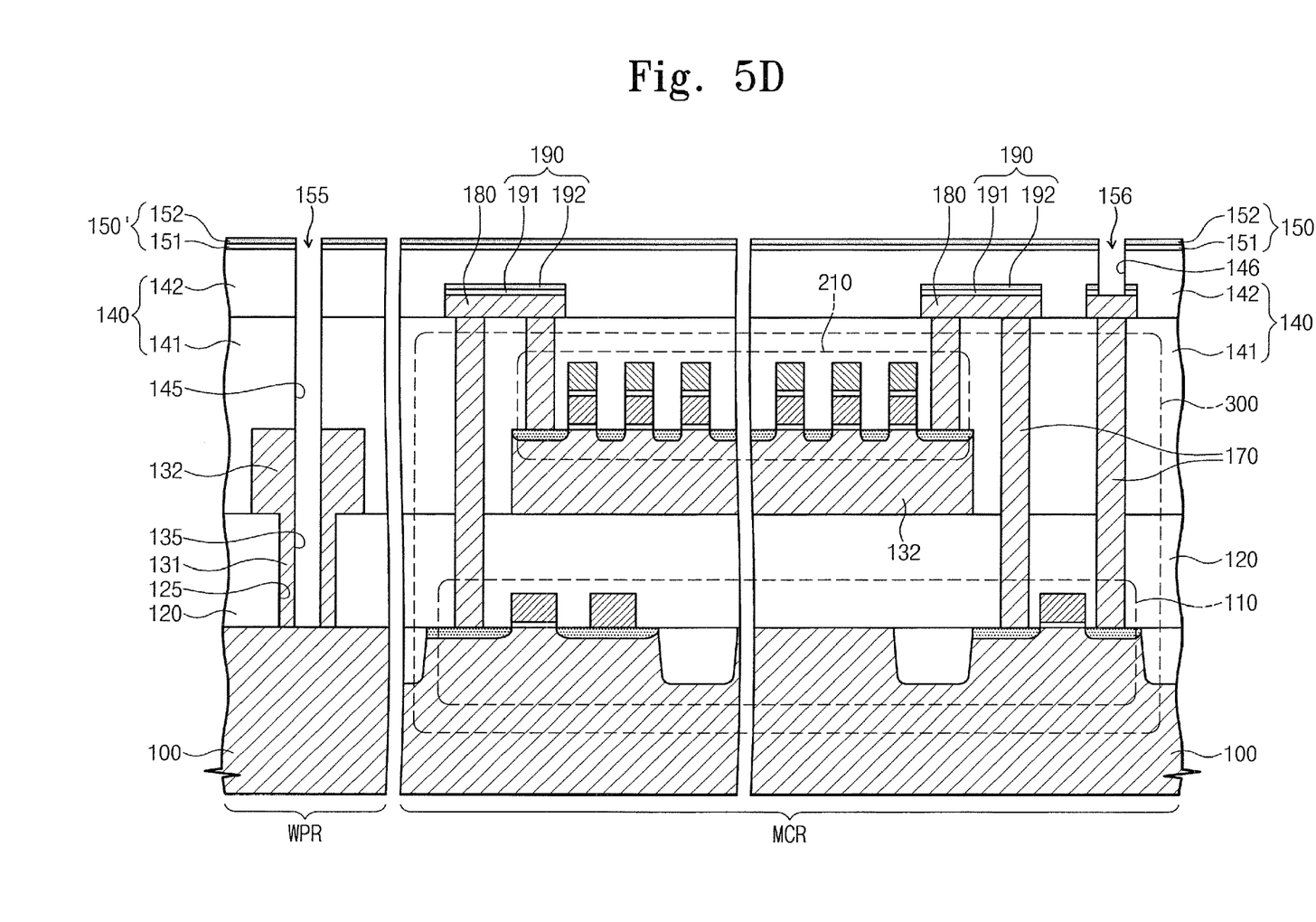

On the other hand, referring to FIG. 5D, the lower capping layer 191 prevents the etching damage of the line pattern 180 that may occur during the forming of the lower contact hole 135. For this, the lower capping layer 191 may be formed of a material having an etch selectivity with respect to the semiconductor layer 132. For example, the lower capping layer 191 may be formed of a silicon oxide layer, like the lower mask layer 152. Furthermore, according to the embodiment in which the lower contact hole 135 passes through the lower interlayer insulating layer 120, the capping layer 190 may further include an auxiliary capping layer (not shown) interposed between the lower capping layer 191 and the line pattern 180. The auxiliary capping layer may be formed of a material having an etch selectivity with respect to the lower interlayer insulating layer 120. For example, the auxiliary capping layer may be formed of a silicon nitride layer, like the auxiliary mask layer 151.

Figure 5E:
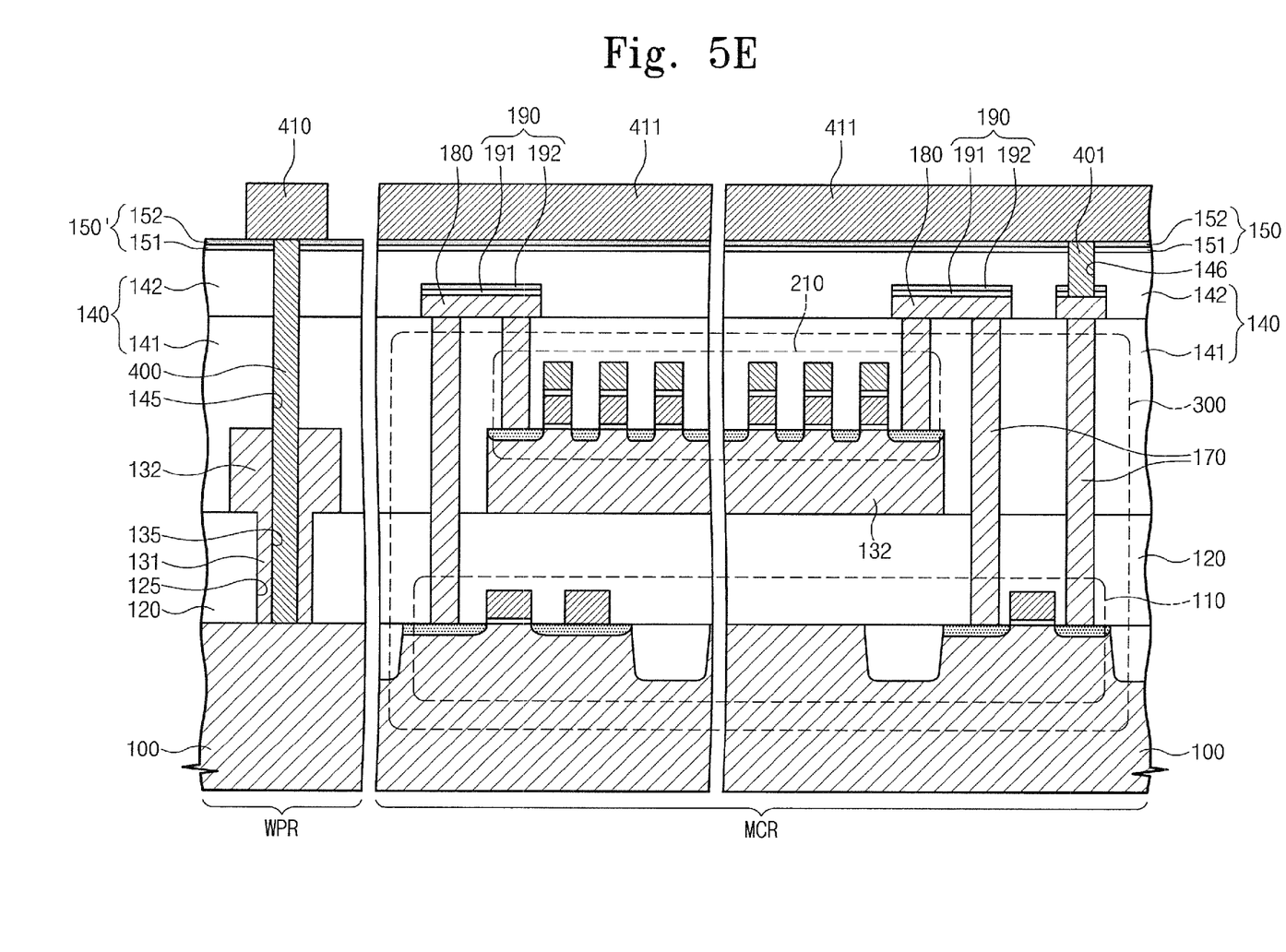

Referring to FIG. 5E, after forming a first plug 400 that fills the lower contact hole 135 and the first upper contact hole 145, a first line 410 is formed on the upper interlayer insulating layer 140 and connects to the first plug 400. Consequently, the first line 410 is directly connected to the semiconductor layer 132 and the semiconductor wafer 100 through the first plug 400. At this point, bulk bias may be applied to the first line 410.

According to the one embodiment of the present invention, the forming of the first plug 400 and the first line 410 may be used for forming a second plug 401 and a second line 411 in the memory cell region MCR. At this point, as illustrated in FIG. 5E, the second plug 401 is disposed in the second upper contact hole 146 to connect to the line pattern 180, and the second line 411 is disposed on the upper interlayer insulating layer 140 to connect to the second plug 401. Furthermore, the second line 411 may be connected to source/drain electrodes of the select transistors through the source/drain plugs 170.

According to some embodiments of the present invention, after sequentially forming the lower and upper layers, a multi-layer mask layer is formed of materials having an etch selectivity with respect to the lower and upper layers and is disposed on the upper layer. Next, the lower and upper layers are patterned using the etch selectivity of the multi-layer mask layer in order to form a contact hole having a high aspect-ratio without the etching damage of the upper layer in the lower and upper layers. According to some embodiments of the present invention, the contact hole with a high aspect-ratio, which is required in the semiconductor device having the three-dimensionally arranged transistors, can be formed without the etching damage of the upper layer.

Embodiments of the present invention provide methods of fabricating a semiconductor device, the methods comprising: sequentially forming a lower pattern and an upper layer on a semiconductor substrate; sequentially forming a lower mask layer and an upper mask layer on the upper layer; sequentially patterning the lower and upper mask layers to form a hole exposing a top surface of the upper layer on the lower pattern; using the upper mask layer as an etching mask to anisotropically etch the exposed top surface to form an upper contact hole exposing a top surface of the lower pattern; and using the lower mask layer as an etching mask to anisotropically etch the exposed lower pattern to form a lower contact hole extending from the upper contact hole in the lower pattern.

In some embodiments, the upper mask layer is formed of a material having an etch selectivity with respect to the upper layer, and the lower mask layer is formed of a material having an etch selectivity with respect to the lower pattern. The upper layer may be a silicon oxide layer; the lower pattern may be a silicon layer; the upper mask layer may be one of a silicon nitride layer and a polycrystalline silicon layer; and the lower mask layer may be a silicon oxide layer.

In other embodiments, the methods, before the forming of the lower mask layer, further include forming an auxiliary mask layer on the upper layer, the auxiliary mask layer being formed of a material having an etch selectivity with respect to the lower mask layer.

In still other embodiments, the upper contact hole and the lower contact hole are continuously formed in the same process chamber. The lower contact hole comprises a thickness between 3000 and 10000 Å and an aspect-ratio of at least 5.

In still other embodiments, the methods further include forming a lower circuit on the semiconductor substrate, a semiconductor layer on the semiconductor substrate, and an upper circuit on the semiconductor layer. The forming of the semiconductor layer is performed using an epitaxial process, the epitaxial process using the lower pattern as a seed layer.

In yet other embodiments, the methods further include forming line patterns on one side of the lower pattern, the line patterns being connected to at least one of the lower circuit and the upper circuit. The hole is formed to expose an upper surface of the upper layer on the line pattern and the lower pattern.

In further embodiments, the line pattern includes a sequentially-stacked metal layer and capping layer, the capping layer being formed of a material having an etch selectivity with respect to the upper layer and the lower pattern. The capping layer is formed of a sequentially-stacked silicon oxide layer and silicon nitride layer.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of fabricating a semiconductor device, the method comprising:
sequentially forming a lower pattern and an upper layer on a semiconductor substrate;
sequentially forming a lower mask layer and an upper mask layer on the upper layer;
sequentially patterning the lower and upper mask layers to form a hole exposing a top surface of the upper layer on the lower pattern;
anisotropically etching the exposed upper layer, using the upper mask layer as an etching mask, to form an upper contact hole exposing a top surface of the lower pattern; and
anisotropically etching the exposed lower pattern, using the lower mask layer as an etching mask to form a lower contact hole in the lower pattern, the lower contact hole extending from the upper contact hole.

2. The method of claim 1, before the forming of the lower mask layer, further comprising forming an auxiliary mask layer on the upper layer, the auxiliary mask layer comprising a material having an etch selectivity with respect to the lower mask layer.

3. The method of claim 1, wherein the upper contact hole and the lower contact hole are continuously formed in the same process chamber.

4. The method of claim 1, wherein the lower contact hole comprises a thickness between about 3000 and about 10000 Å and an aspect-ratio of at least about 5.

5. The method of claim 1, wherein the upper mask layer comprises a material having an etch selectivity with respect to the upper layer, and the lower mask layer comprises a material having an etch selectivity with respect to the lower pattern.

6. The method of claim 5, wherein the upper layer is a silicon oxide layer;
the lower pattern is a silicon layer;
the upper mask layer is one of a silicon nitride layer and a polycrystalline silicon layer; and
the lower mask layer is a silicon oxide.

7. The method of claim 1, further comprising forming a lower circuit on the semiconductor substrate, a semiconductor layer over the semiconductor substrate, and an upper circuit on the semiconductor layer,
wherein the forming of the semiconductor layer is performed using an epitaxial process, the epitaxial process using the lower pattern as a seed layer.

8. The method of claim 7, further comprising forming line patterns on one side of the lower pattern, the line patterns being connected to at least one of the lower circuit and the upper circuit,
wherein the hole is formed to expose an upper surface of the upper layer above the line pattern and the lower pattern.

9. The method of claim 8, wherein the line patterns comprise a sequentially-stacked metal layer and capping layer, the capping layer comprising a material having an etch selectivity with respect to the upper layer and the lower pattern.

10. The method of claim 9, wherein the capping layer comprises a sequentially-stacked silicon oxide layer and silicon nitride layer.

11. A method of fabricating a semiconductor device, the method comprising:
forming a lower circuit on a semiconductor substrate;
forming a semiconductor layer over the lower circuit;
sequentially forming an upper interlayer insulating layer, a lower mask layer, and an upper mask layer on the semiconductor layer;
sequentially patterning the lower and upper mask layers to form a hole exposing an upper surface of the upper interlayer insulating layer;
anisotropically etching the exposed upper interlayer insulating layer, using the upper mask layer as an etching mask, to form an upper contact hole exposing an upper surface of the semiconductor layer; and
anisotropically etching the exposed semiconductor layer, using the lower mask layer as an etching mask, to form a lower contact hole in the semiconductor layer, the lower contact hole extending from the upper contact hole.

12. The method of claim 11, wherein the upper mask layer comprises a material having an etch selectivity with respect to the upper interlayer insulating layer, and the lower mask layer comprises a material having an etch selectivity with respect to the semiconductor layer.

13. The method of claim 11, wherein the upper mask layer is one of a silicon nitride layer and a polycrystalline silicon layer, and the lower mask layer is a silicon oxide layer.

14. The method of claim 11, before the forming of the lower mask layer, further comprising forming an auxiliary mask layer on the upper interlayer insulating layer, the auxiliary mask layer comprising a material having an etch selectivity with respect to the lower mask layer.

15. The method of claim 11, after the forming of the lower contact hole, further comprising forming a contact plug used for applying bulk bias to the semiconductor substrate and the semiconductor layer,
wherein the contact plug is ohmically connected with the semiconductor substrate and the semiconductor layer in the lower and upper contact holes.

16. The method of claim 15, further comprising forming a plug concurrently with the contact plug, the plug disposed in a memory cell region of the semiconductor device.

17. The method of claim 11, wherein the forming of the semiconductor layer comprises:
forming a lower interlayer insulating layer that covers the resultant structure having the lower circuit;
patterning the lower interlayer insulating layer to form a seed opening part that exposes a predetermined region of the semiconductor substrate; and
performing an epitaxial process to form a seed pattern filling the seed opening part, and a semiconductor layer extending from the seed pattern to be disposed over the lower circuit, the epitaxial process using the exposed semiconductor substrate as a seed layer.

18. The method of claim 17, wherein the lower contact hole is formed in the seed pattern.

19. The method of claim 17, before the forming of the lower mask layer, further comprising:
forming an upper circuit on the semiconductor layer; and
forming line patterns connected to the upper circuit and comprising a sequentially stacked metal layer and capping layer,
wherein the capping layer comprises a material having an etch selectivity with respect to the upper and lower mask layers.

20. The method of claim 19, wherein the capping layer comprises a sequentially stacked silicon oxide layer and silicon nitride layer.

* * * * *